(12) United States Patent  (10) Patent No.: US 7,893,543 B2
Narita et al.  (45) Date of Patent: Feb. 22, 2011

(54) SEMICONDUCTOR MODULE

(75) Inventors: Akihito Narita, Sakata (JP); Naoya Sato, Sakata (JP)

(73) Assignee: Seiko Epson Corporation (JP)

( * ) Notice: Subject to any disclaimer, the term of this patent is extended or adjusted under 35 U.S.C. 154(b) by 176 days.

(21) Appl. No.: 12/392,288

(22) Filed: Feb. 25, 2009

(65) Prior Publication Data

US 2009/0218674 A1 Sep. 3, 2009

(30) Foreign Application Priority Data

Mar. 3, 2008 (JP) ............................... 2008-051968

(51) Int. Cl.
H01L 23/48 (2006.01)
(52) U.S. Cl. ................. 257/778; 257/E23.01
(58) Field of Classification Search .................. 257/778, 257/E23.01
See application file for complete search history.

(56) References Cited

U.S. PATENT DOCUMENTS

| 7,705,454 | B2 | 4/2010 | Hashimoto | |
| 2009/0050353 | A1 | 2/2009 | Hashimoto | |
| 2009/0218674 | A1* | 9/2009 | Narita et al. | 257/690 |
| 2010/0155945 | A1 | 6/2010 | Hashimoto | |

FOREIGN PATENT DOCUMENTS

| CN | 1913138 | 2/2007 |
| JP | 2007-042867 | 2/2007 |
| JP | 2009-49225 | 3/2009 |

* cited by examiner

*Primary Examiner*—Mark Prenty
(74) *Attorney, Agent, or Firm*—Harness, Dickey & Pierce, P.L.C.

(57) ABSTRACT

A semiconductor module including: a semiconductor chip, an integrated circuit being formed in the semiconductor chip; a plurality of electrodes electrically connected to the integrated circuit; an insulating film formed on the semiconductor chip and having a plurality of openings positioned corresponding to the plurality of electrodes; and a long elastic protrusion extending on the insulating film. A plurality of interconnects respectively extend from over the electrodes to over the elastic protrusion, directions of the interconnects intersecting an axis AX that is parallel to the extending direction of the elastic protrusion. A plurality of leads are respectively in contact with the interconnects in an area positioned on the elastic protrusion. A cured adhesive maintains a space between a surface of the semiconductor chip on which the elastic protrusion is formed and a surface of the elastic substrate on which the leads are formed. A surface of the elastic protrusion except an area on which the interconnects are provided is in close contact with the elastic substrate due to an elastic force.

2 Claims, 3 Drawing Sheets

SEMICONDUCTOR MODULE

Japanese Patent Application No. 2008-51968, filed on Mar. 3, 2008, is hereby incorporated by reference in its entirety.

BACKGROUND OF THE INVENTION

The present invention relates to a semiconductor module.

A technique for forming a long resin protrusion on a semiconductor chip and further forming a plurality of interconnects on the resin protrusion to provide elastic terminals has been known (see JP-A-2007-42867). However, JP-A-2007-42867 does not disclose measures against migration of a metal that forms interconnects migrates between the interconnects and causes insulation failure.

SUMMARY

According to one aspect of the invention, there is provided a semiconductor module comprising:

a semiconductor chip, an integrated circuit being formed in the semiconductor chip;

a plurality of electrodes formed on the semiconductor chip and electrically connected to the integrated circuit;

an insulating film formed on the semiconductor chip and having a plurality of openings positioned corresponding to the plurality of electrodes;

a long elastic protrusion extending on the insulating film;

a plurality of interconnects respectively extending from over the plurality of electrodes to over the elastic protrusion, directions of the plurality of interconnects intersecting a longitudinal axis of the elastic protrusion;

an elastic substrate on which a plurality of leads are formed, the plurality of leads respectively being in contact with the plurality of interconnects in an area positioned on the elastic protrusion; and a cured adhesive maintaining a space between a surface of the semiconductor chip on which the elastic protrusion is formed and a surface of the elastic substrate on which the plurality of leads are formed, a surface of the elastic protrusion except an area on which the plurality of interconnects are provided being in close contact with the elastic substrate due to an elastic force.

DETAILED DESCRIPTION OF THE EMBODIMENT

Figure 1:
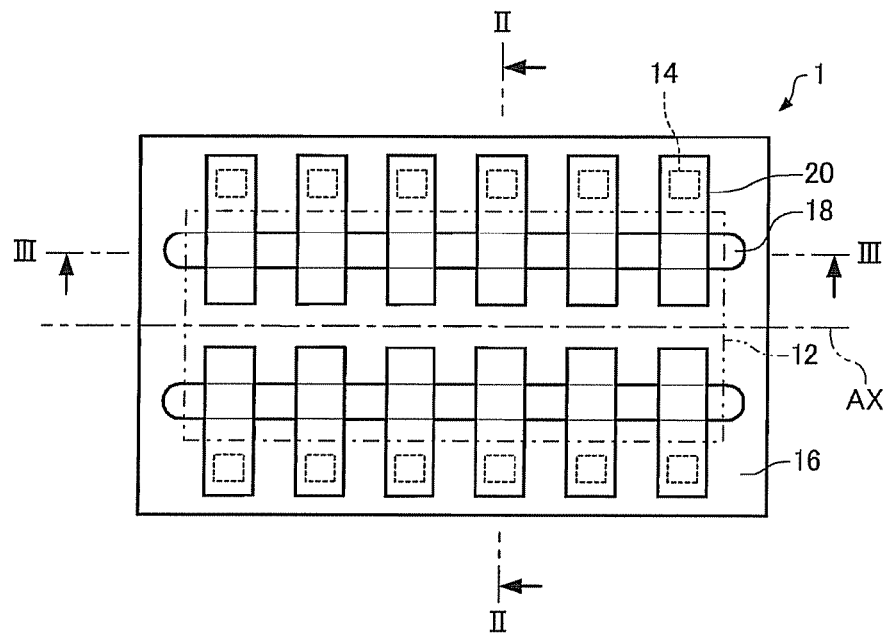
FIG. 1 is a plan view showing a semiconductor device used for a semiconductor module according to one embodiment of the invention.

The invention may prevent occurrence of migration.

(1) According to one embodiment of the invention, there is provided a semiconductor module comprising:

a semiconductor chip, an integrated circuit being formed in the semiconductor chip;

a plurality of electrodes formed on the semiconductor chip and electrically connected to the integrated circuit;

an insulating film formed on the semiconductor chip and having a plurality of openings positioned corresponding to the plurality of electrodes;

a long elastic protrusion extending on the insulating film;

a plurality of interconnects respectively extending from over the plurality of electrodes to over the elastic protrusion, directions of the plurality of interconnects intersecting a longitudinal axis of the elastic protrusion;

an elastic substrate on which a plurality of leads are formed, the plurality of leads respectively being in contact with the plurality of interconnects in an area positioned on the elastic protrusion; and a cured adhesive maintaining a space between a surface of the semiconductor chip on which the elastic protrusion is formed and a surface of the elastic substrate on which the plurality of leads are formed, a surface of the elastic protrusion except an area on which the plurality of interconnects are provided being in close contact with the elastic substrate due to an elastic force.

According to this embodiment, since a surface of the elastic protrusion except an area on which the interconnects are provided is in close contact with the elastic substrate (i.e., only one interface is formed between the elastic protrusion and the elastic substrate), the number of moisture entrance paths is reduced. When the adhesive is interposed between the elastic protrusion and the elastic substrate, two interfaces are formed so that the number of moisture entrance paths increases and ionic migration easily occurs. According to this embodiment, however, such ionic migration can be prevented. Since the adhesive is not interposed between the elastic protrusion and the elastic substrate, a substance that is generally included in the adhesive and is easily ionized is absent between the interconnects. This also prevents ionic migration. Since the adhesive shrinks upon curing, interfacial separation easily occurs when the cured adhesive is interposed between the elastic protrusion and the elastic substrate. According to this embodiment, however, since the adhesive is not interposed between the elastic protrusion and the elastic substrate and the elastic protrusion and the elastic substrate is in close contact with each other due to an elastic force, interfacial separation rarely occurs.

(2) In this semiconductor module, the elastic substrate may have a plurality of first depressions formed by elastic deformation;

each of the plurality of leads may be in contact with corresponding one of the plurality of interconnects on a surface of corresponding one of the plurality of first depressions;

the elastic protrusion may have a plurality of second depressions formed by elastic deformation; and each of the plurality of interconnects may be in contact with corresponding one of the plurality of leads on a surface of corresponding one of the plurality of second depressions.

Semiconductor Device

Figure 2:
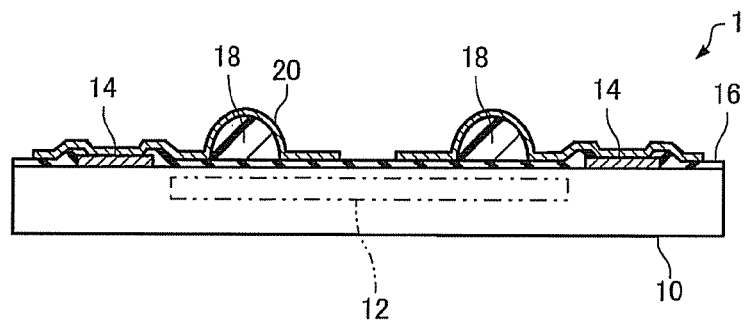
FIG. 2 is a cross-sectional view showing the semiconductor device shown in FIG. 1 taken along the line II-II.
Figure 3:
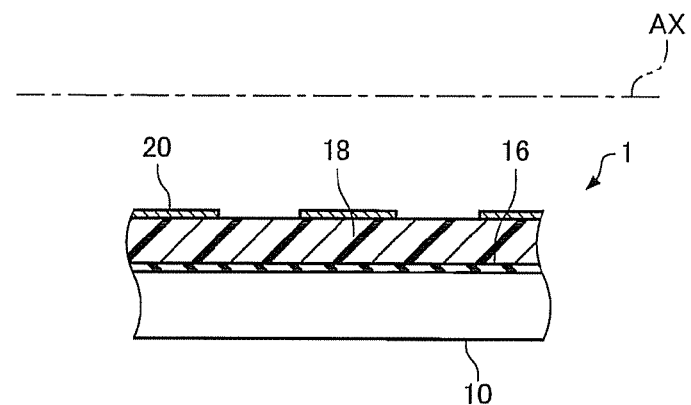
FIG. 3 is a cross-sectional view showing the semiconductor device shown in FIG. 1 taken along the line III-III.
Figure 4A:
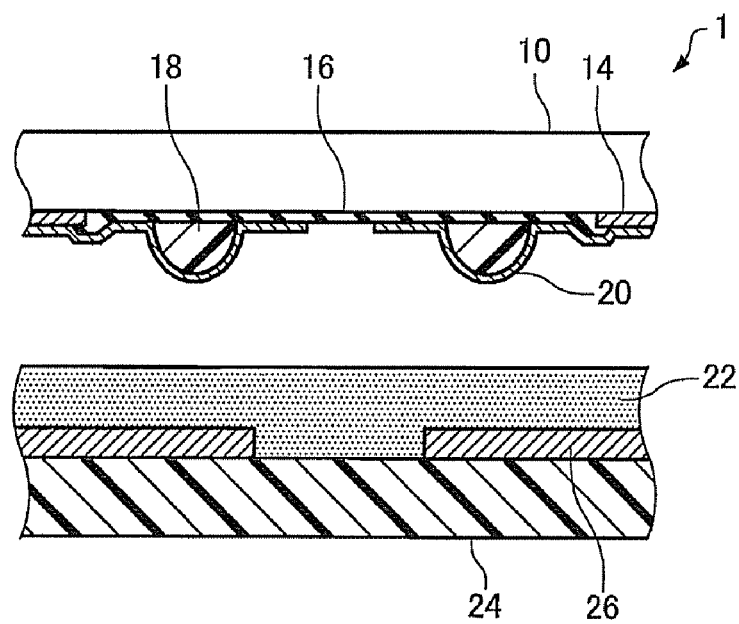
FIGS. 4A and 4B illustrate a method of producing a semiconductor module according to one embodiment of the invention.
Figure 4B:
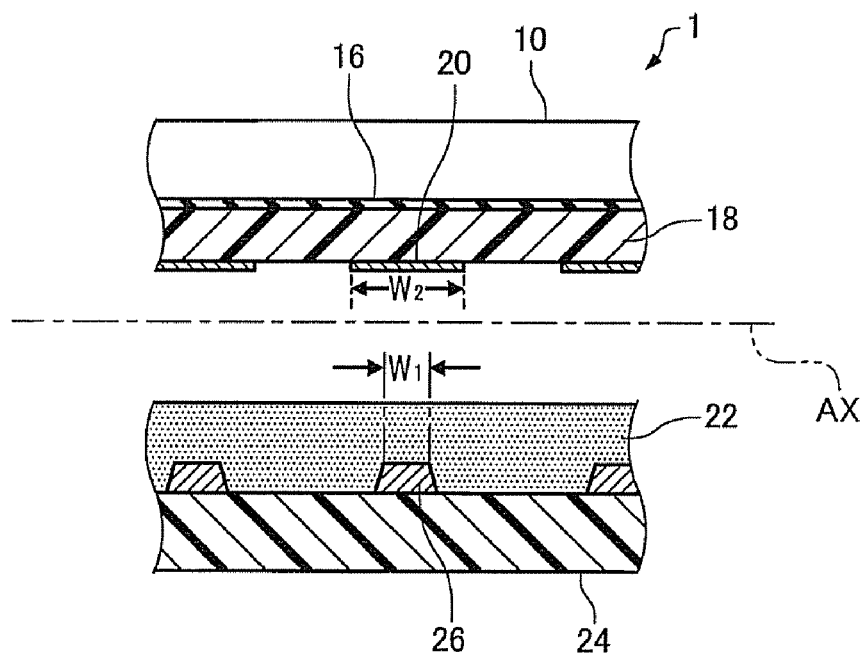

FIG. 1 is a plan view showing a semiconductor device used for a semiconductor module according to one embodiment of the invention. FIG. 2 is a cross-sectional view showing the semiconductor device shown in FIG. 1 taken along the line II-II, and FIG. 3 is a cross-sectional view showing the semiconductor device shown in FIG. 1 taken along the line III-III.

A semiconductor device 1 includes a semiconductor chip 10. The semiconductor chip 10 has a rectangular surface. An integrated circuit 12 (e.g., transistors) is formed in the semiconductor chip 10. A plurality of electrodes 14 are formed on the semiconductor chip 10 and are electrically connected to the integrated circuit 12. The electrodes 14 are arranged in one row or a plurality of rows (a plurality of parallel rows). The electrodes 14 are arranged (in parallel) along the side (e.g., long side) of the rectangular surface of the semiconductor chip 10. The electrodes 14 are electrically connected to the integrated circuit 12 through internal interconnects (not shown). An insulating film 16 (e.g., passivation film) that has openings positioned corresponding to the electrodes 14 is formed on the semiconductor chip 10 so that the electrodes 14 are at least partially exposed. The insulating film 16 may be formed only of an inorganic material (e.g., $SiO_2$ or SiN), for example. The insulating film 16 is formed over the integrated circuit 12.

An elastic protrusion 18 is formed on the semiconductor chip 10 (insulating film 16). In FIGS. 1 to 3, the elastic protrusion 18 extends along the side (e.g., long side) of the rectangular surface of the semiconductor chip 10. A plurality of elastic protrusions 18 are arranged in parallel. The elastic protrusion 18 undergoes elastic deformation. As the material for the elastic protrusion 18, a polyimide resin, a silicone-modified polyimide resin, an epoxy resin, a silicone-modified epoxy resin, benzocyclobutene (BCB), polybenzoxazole (PBO), an acrylic resin, a silicone resin, a phenol resin, or the like may be used.

The elastic protrusion 18 is extended to be long. The cross section of the elastic protrusion 18 perpendicular to an axis AX that is parallel to an extending direction of the elastic protrusion has an arched shape having an arc and a chord, as shown in FIG. 2. A part of the elastic protrusion 18 corresponding to the chord is disposed on the insulating film 16, and a surface of the elastic protrusion 18 opposite to the semiconductor chip 10 is convexly curved. The curved surface of the elastic protrusion 18 is part of a surface of revolution that is drawn by rotating a straight line parallel to the longitudinal axis (rotation axis) of the elastic protrusion 18 around the rotation axis. The surface of the elastic protrusion 18 is a curved surface of a shape obtained by cutting a column along a plane in parallel with the center axis of the column. The elastic protrusion 18 widens toward the bottom so that the bottom surface is larger than the upper surface.

A plurality of interconnects 20 are formed on the semiconductor chip 10. As the material for the interconnects 20, Au, Ti, TiW, W, Cr, Ni, Al, Cu, Pd, lead-free solder, or the like may be used. Each of the interconnects 20 extends from over one of the electrodes 14 to over the elastic protrusion 18. The interconnects 20 are formed at intervals on the upper surface of the elastic protrusion 18. A plurality of interconnects 20 are formed on one elastic protrusion 18. The interconnects 20 extend to intersect the axis AX that is parallel to the extending direction of the elastic protrusion 18. Each of the interconnects 20 extends from over one of the electrodes 14, over the insulating film 16, and to over the elastic protrusion 18. The surface of the interconnects 20 are curved along the surface of the elastic protrusion 18. The interconnect 20 may be directly in contact with the electrode 14, or a conductive film (not shown) may be interposed between the interconnect 20 and the electrode 14. The interconnect 20 extends beyond the elastic protrusion 18 to the insulating film 16 on the side opposite to the electrode 14.

Method of Producing Semiconductor Module

FIGS. 4A to 5B illustrate a method of producing a semiconductor module according to one embodiment of the invention. In this embodiment, the above-described semiconductor device 1 is mounted on an elastic substrate 24 through an adhesive 22. The elastic substrate 24 undergoes elastic deformation, and may be a flexible substrate formed of a resin or the like. A lead 26 is formed on the elastic substrate 24. A width $W_1$ of the lead 26 that perpendicularly intersects the extension direction of the lead 26 (i.e., the direction perpendicular to the plane of FIG. 4B) is smaller than a width $W_2$ of the interconnect 20 that perpendicularly intersects the extension direction of the interconnect 20 (i.e., the direction perpendicular to the plane of FIG. 4B).

The lead 26 is disposed so that the lead 26 comes in contact with part of the interconnect 20 positioned on the elastic protrusion 18 and extends to intersect the axis AX that is parallel to the extending direction of the elastic protrusion 18. A pressing force is then applied to the semiconductor device 1 and the elastic substrate 24. This causes the interconnects 20 on the elastic protrusion 18 to come in contact with the leads 26.

Figure 5A:
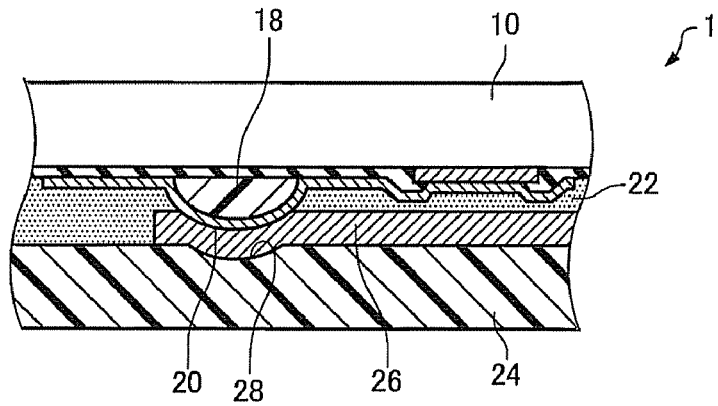
FIGS. 5A and 5B further illustrate a method of producing a semiconductor module according to one embodiment of the invention.
Figure 5B:
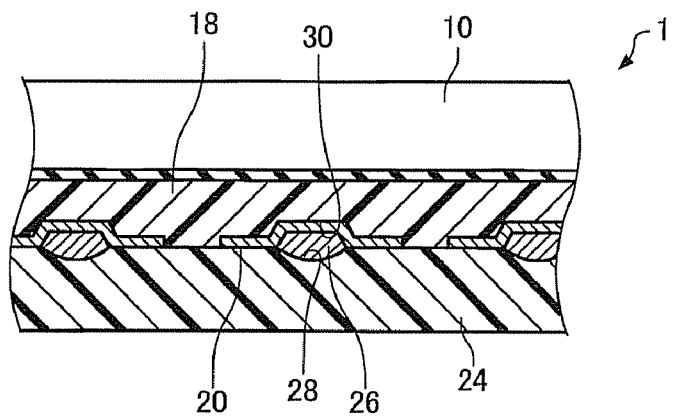

As shown in FIGS. 5A and 5B, a pressing force is further applied to the semiconductor device 1 and the elastic substrate 24 so that the lead 26 sinks in the elastic substrate 24 to form a first depression 28, and the interconnect 20 and the lead 26 sink in the elastic protrusion 18 to form a second depression 30. In this case, the elastic substrate 24 and the elastic protrusion 18 undergo elastic deformation. A surface of the elastic protrusion 18 except an area on which the interconnects 20 are provided is then closely in contact with the elastic substrate 24 due to an elastic force. The adhesive 22 flows between (e.g., is discharged from the space between) the semiconductor device 1 and the elastic substrate 24 due to the pressing force. The adhesive 22 is then cured and shrunk by applying heat. The pressing force is maintained until the adhesive 22 is cured. The pressing force is removed when the adhesive 22 has been cured. A semiconductor module is thus produced.

Semiconductor Module

Figure 6:
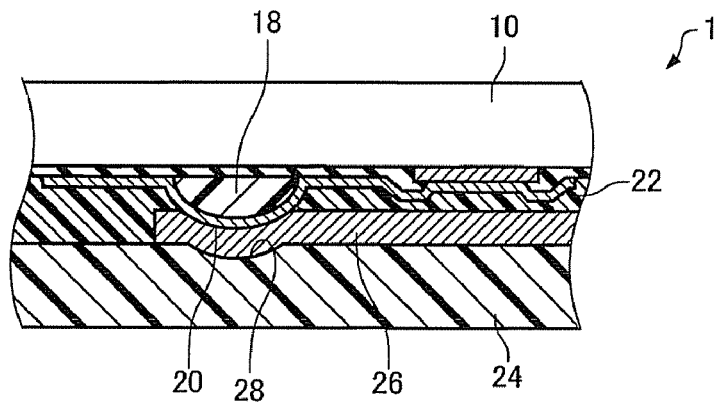
FIG. 6 illustrates a semiconductor module according to one embodiment of the invention.

FIG. 6 illustrates a semiconductor module according to one embodiment of the invention. The semiconductor module includes the semiconductor device 1 and the elastic substrate 24 described above. The elastic substrate 24 supports the side of the lead 26 opposite to the elastic protrusion 18.

The elastic substrate 24 has a plurality of first depressions 28 formed by elastic deformation. The inner surface of the first depression 28 is curved corresponding to the surface of the elastic protrusion 18. Each of the leads 26 is in contact with one of the interconnects 20 on a surface of one of the first depressions 28. The surface of the lead 26 that faces the first depression 28 is curved. Therefore, since the area of the contact surface of the lead 26 with the elastic substrate 24 increases when the contact surface is curved (see FIG. 6) as compared with when the contact surface is flat (see FIG. 4B), dissipation of heat from the lead 26 to the elastic substrate 24 increases.

The elastic protrusion 18 has a plurality of second depressions 30 formed by elastic deformation (see FIG. 5B). Each of the interconnects 20 is in contact with one of the leads 26 on a surface of one of the second depressions 30. A surface of the elastic protrusion 18 except an area on which the interconnects 20 are provided is in close contact with the elastic substrate 24 due to an elastic force.

The adhesive 22 maintains a space between the surface of the semiconductor chip 10 on which the elastic protrusions 18 are formed and the surface of the elastic substrate 24 on which the leads 26 are formed. The adhesive 22 has been cured and shrunk. The adhesive 22 contains a residual stress due to shrinkage during curing.

According to this embodiment, since a surface of the elastic protrusion 18 except an area on which the interconnects are formed is in close contact with the elastic substrate 24 (i.e., only one interface is formed between the elastic protrusion 18 and the elastic substrate 24), the number of moisture entrance paths is reduced. Specifically, since two interfaces are formed when the adhesive 22 is interposed between the elastic protrusion 18 and the elastic substrate 24, the number of moisture entrance paths increases. As a result, ionic migration easily occurs. According to this embodiment, such ionic migration can be prevented. Since the adhesive 22 is not interposed between the elastic protrusion 18 and the elastic substrate 24, a substance that is generally included in the adhesive 22 and is easily ionized (alkali metals such as sodium and potassium (Group 1 elements excluding hydrogen) or halogens such as fluorine, chlorine, and bromine (Group 17 elements)) is absent between the interconnects 20. This also prevents ionic migration. Since the adhesive 22 shrinks upon curing, interfacial separation easily occurs when the cured adhesive 22 is interposed between the elastic protrusion 18 and the elastic substrate 24. According to this embodiment, the adhesive 22 is not interposed between the elastic protrusion 18 and the elastic substrate 24, and the elastic protrusion 18 and the elastic substrate 24 are in close contact with each other due to an elastic force. Therefore, interfacial separation rarely occurs.

Examples of an electronic instrument provided with the semiconductor module include a notebook personal computer, a portable telephone, and the like.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of this invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. A semiconductor module comprising:
   a semiconductor chip, an integrated circuit being formed in the semiconductor chip;
   a plurality of electrodes formed on the semiconductor chip and electrically connected to the integrated circuit;
   an insulating film formed on the semiconductor chip and having a plurality of openings positioned corresponding to the plurality of electrodes;
   a long elastic protrusion extending on the insulating film;
   a plurality of interconnects respectively extending from over the plurality of electrodes to over the elastic protrusion, directions of the plurality of interconnects intersecting a longitudinal axis of the elastic protrusion;
   an elastic substrate on which a plurality of leads are formed, the plurality of leads respectively being in contact with the plurality of interconnects in an area positioned on the elastic protrusion; and
   a cured adhesive maintaining a space between a surface of the semiconductor chip on which the elastic protrusion is formed and a surface of the elastic substrate on which the plurality of leads are formed,
   a surface of the elastic protrusion except an area on which the plurality of interconnects are provided being in close contact with the elastic substrate due to an elastic force.

2. The semiconductor module as defined in claim 1,
   the elastic substrate having a plurality of first depressions formed by elastic deformation;
   each of the plurality of leads being in contact with corresponding one of the plurality of interconnects on a surface of corresponding one of the plurality of first depressions;
   the elastic protrusion having a plurality of second depressions formed by elastic deformation; and
   each of the plurality of interconnects being in contact with corresponding one of the plurality of leads on a surface of corresponding one of the plurality of second depressions.

* * * * *